United States Patent
Koshita

(10) Patent No.: US 6,597,607 B2
(45) Date of Patent: Jul. 22, 2003

(54) SEMICONDUCTOR MEMORY DEVICE AND ITS OPERATION METHOD

(75) Inventor: Gen Koshita, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/074,109

(22) Filed: Feb. 12, 2002

(65) Prior Publication Data

US 2002/0126551 A1 Sep. 12, 2002

(30) Foreign Application Priority Data

Feb. 13, 2001 (JP) ........................................ 2001-036141

(51) Int. Cl.[7] .............................................. G11C 29/00
(52) U.S. Cl. ...................................... 365/200; 365/201
(58) Field of Search ................................. 365/200, 201, 365/202, 189.07, 230.06

(56) References Cited

U.S. PATENT DOCUMENTS 5,357,473 A * 10/1994 Mizuno et al. ............. 365/201
6,367,030 B1 * 4/2002 Yamauchi ...................... 714/7

FOREIGN PATENT DOCUMENTS

JP            11-203889        7/1999

OTHER PUBLICATIONS

English Bibliography and Abstract of JP 11–203889.

* cited by examiner

*Primary Examiner*—Hoai Ho
*Assistant Examiner*—Gene N. Auduong
(74) *Attorney, Agent, or Firm*—Darryl G. Walker; Bradley T. Sako

(57) ABSTRACT

A semiconductor memory device including a plurality of normal memory cells (11) and redundant memory cells (12) is disclosed. Normal memory cells (11) may include true normal memory cells and complement normal memory cells. Redundant memory cells (12) may include true redundant memory cells and complement redundant memory cells. When a normal memory cell (11) is found to be a defective memory cell, it may be replaced by a replacement redundant memory cell from the plurality of redundant memory cells (12). A defective memory cell that is a true normal memory cell may be replaced with a replacement memory cell that is a true redundant memory cell and a defective memory cell that is a complement memory cell may be replaced with a replacement memory cell that is a complement redundant memory cell. In this way, electric and physical conditions of a replacement memory cell may be essentially the same as the electric and physical conditions of the defective memory cell would have been had it not been replaced.

20 Claims, 6 Drawing Sheets

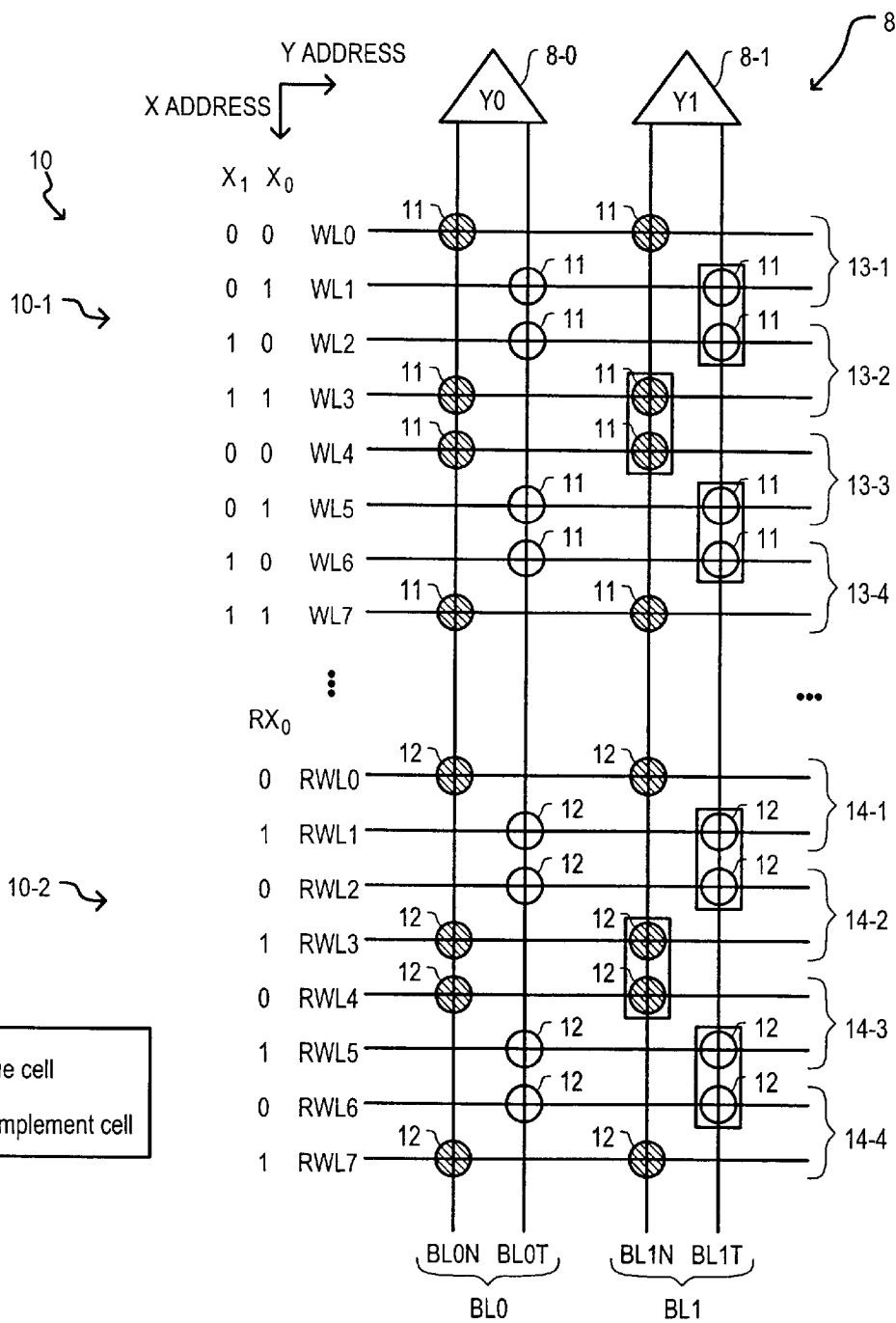
FIG. 3
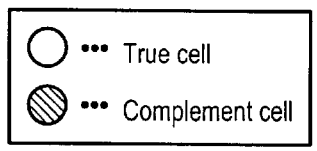
○ ··· True cell
⊘ ··· Complement cell
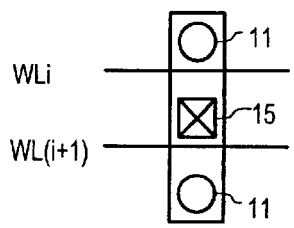
FIG. 4

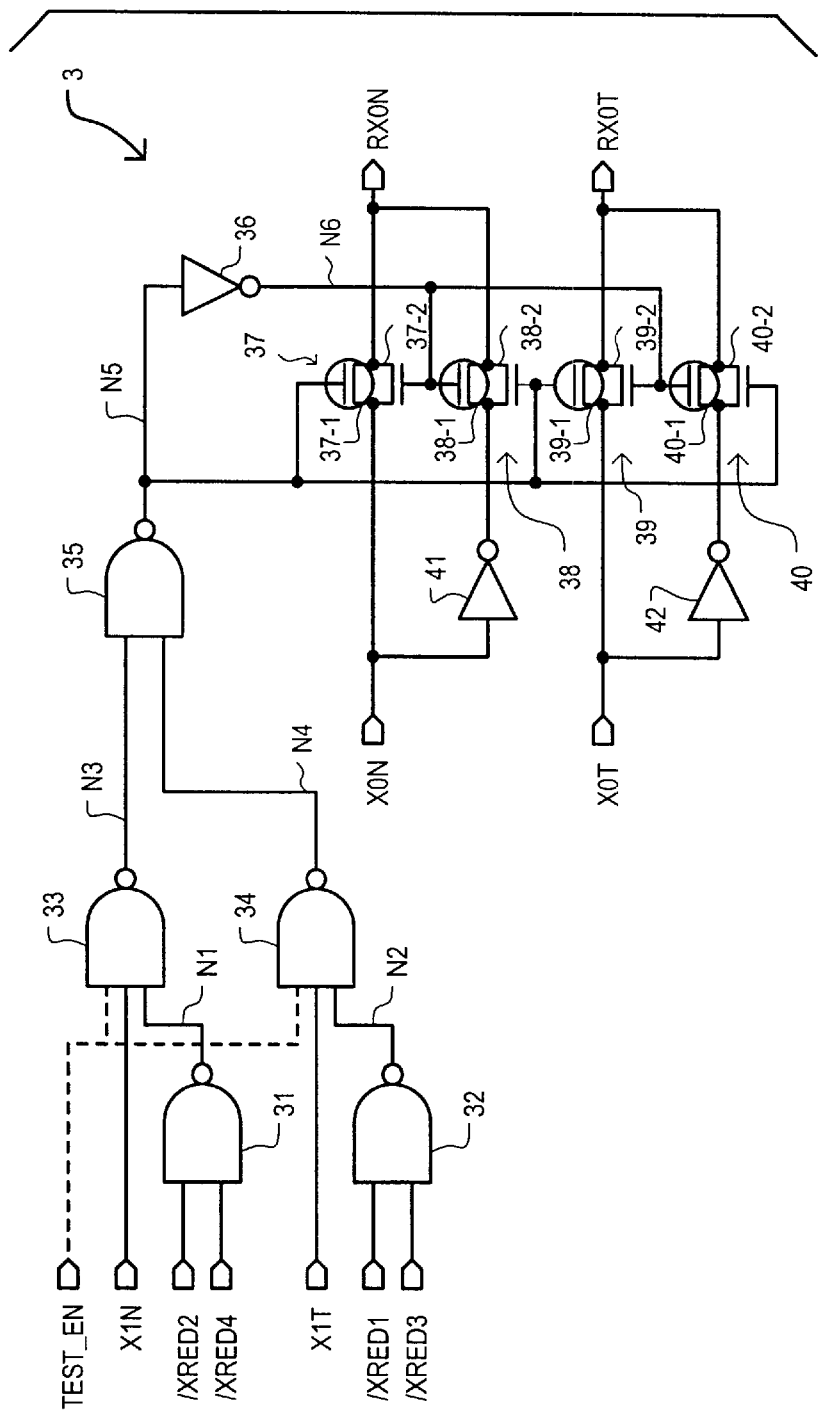

SEMICONDUCTOR MEMORY DEVICE AND ITS OPERATION METHOD

TECHNICAL FIELD

The present invention relates generally to a semiconductor memory device and its operation method and more specifically to redundant memory cells used to replace defective memory cells in a semiconductor memory device and its operation method.

BACKGROUND OF THE INVENTION

It is a continuing goal to improve the overall yield of good semiconductor memory devices in order to reduce manufacturing costs. As the degree of integration of a semiconductor memory device becomes greater, the likelihood of occurrence of defective memory cells increases. One method of improving yield is through the use of redundant memory cells that can be used to replace defective memory cells. By replacing defective memory cells with redundant memory cells, some devices that include defects can be saved, thus yield can be improved and manufacturing costs may be reduced.

It is desirable, that when defective memory cells are replaced with redundant memory cells, that the redundant memory cells are properly characterized for the possibility of defects. This can reduce the likelihood of defective parts from being included in parts shipped to customers.

One method of testing is a cell stress test. In a cell stress test, all memory cells have a potential written into them so that a high electric field can be induced across a dielectric layer in each memory cell. However, in some cases it may be required to know the physical layout of the memory cells to determine whether a logic zero or a logic one needs to be written into a particular address location in order to ensure that the proper potential is written into the particular memory cell corresponding to the particular address location. However, when a redundant memory cell is used to replace a defective memory cell, the particular physical cell layout mapping with respect to address values is modified. This can have adverse affects on such a cell stress test and therefore compromise test results.

One such method of addressing this problem has been disclosed in Japanese Laid-Open Patent Publication No. Hei 11-203889 and will be discussed with reference to FIG. 1.

Referring now to FIG. 1, a block schematic diagram of a conventional semiconductor memory device is set forth and given the general reference character 100.

Conventional semiconductor memory device 100 has an address buffer 117, a row decoder 113, a column decoder 115, a spare row decoder 114, a memory cell array 101, a sense amplifier circuit 103, a program circuit 119, a block decision section 116, a data scramble control circuit 120, a clock generator circuit 121, a logical gate 122, an input buffer 111, a scramble circuit 108, and an output buffer 105. The output buffer 105 has a preamplifier 107, scramble circuit 108, and a main amplifier 109.

Memory cell array 101 has normal memory cells and redundant memory cells. When a normal memory cell is defective, it is replaced by a redundant memory cell. Each normal memory cell and each redundant memory cell stores either true data or complementary data. True data means that the stored data in a memory cell has a high potential when a data one is stored and a low potential when data zero is stored. Complementary data means that the stored data in a memory cell has a low potential when a data one is stored and a high potential when data zero is stored.

Block decision section 116 determines whether or not a redundant memory cell that replaces a normal memory cell stores data that is inverted with respect to data that would be stored in the replaced normal memory cell.

Data scramble control circuit 120 generates a scramble on signal SON having a high logic level when a redundant memory cell is stored data that is inverted with respect to data that would be stored in the replaced normal memory cell. When scramble on signal SON has a high logic level, scramble circuit 110 reverses write data to be written in the redundant memory cell. Likewise, to keep data coherency, when scramble on signal SON is high, scramble circuit 108 reverses read data read from the redundant memory cell.

In this way, conventional semiconductor memory device 100 writes data at the same potential level in a redundant memory cell as would be written in the replaced memory cell if it were not defective. Thus, it is possible to perform a stress test in which stress can be applied to the redundant memory cell in a similar manner as the normal memory cell.

However, in stress tests, it is also important to consider cell to cell breakdown conditions. In this case, it is important to write patterns so that the potential written into adjacent or nearby memory cells are known. In this way, a cell to cell stress can be performed.

Consider a test in which data one is written to all memory cells. When data one is written to all cells, half of the memory cells receive a high potential and half of the memory cells receive a low potential. Thus, cell to cell stress can be tested.

In this example, a first redundant memory cell stores a logic one with a high potential, a second redundant memory cell (physically adjacent to the first redundant memory cell) stores a logic one with a low potential, and a normal memory cell stores a logic one with a high potential. When the first redundant memory cell is used and the second redundant memory cell is not used, a high potential is written in the first redundant memory cell and a low potential is written into the second redundant memory cell. Thus, stress between the first and second redundant memory cells is tested. However, when the normal memory cell is replaced by the second redundant memory cell, inverted write data is written into the second redundant memory cell. Thus, a high potential is written into both the first and second redundant memory cells. In this case, cell to cell stress between the first and second redundant memory cells is not properly tested and defects may not be captured in testing.

It is desirable to keep similar electrical stress conditions in a redundant memory cell that is used to replace a normal memory cell as would occur in the normal memory cell.

In light of the above discussion, it would be desirable to provide a semiconductor memory device where electrical stress conditions in a redundant memory cell that is used to replace a normal memory cell may be similar to electrical stress conditions as would occur in the normal memory cell.

SUMMARY OF THE INVENTION

A semiconductor memory device according to the present embodiments may include a plurality of normal memory cells and redundant memory cells. Normal memory cells may include true normal memory cells and complement normal memory cells. Redundant memory cells may include true redundant memory cells and complement redundant memory cells. When a normal memory cell is found to be a defective memory cell, it may be replaced by a replacement redundant memory cell from the plurality of redundant memory cells. A defective memory cell that is a true normal memory cell may be replaced with a replacement memory cell that is a true redundant memory cell and a defective memory cell that is a complement memory cell may be replaced with a replacement memory cell that is a complement redundant memory cell. In this way, electric and physical conditions of a replacement memory cell may be essentially the same as the electric and physical conditions of the defective memory cell would have been had it not been replaced.

According to one aspect of the embodiments, a memory device may include a plurality of normal memory cells and plurality of redundant memory cells. Normal memory cells may include a first memory cell type that may store a first logic level with a first memory cell state and a second memory cell type that may store the first logic level with a second memory cell state. Redundant memory cells may include a first redundant memory cell type that may store the first logic level with the first memory cell state and a second redundant memory cell type that may store the first logic level with the second memory cell state. A replacement section may replace at least one normal memory cell with at least one redundant memory cell when the at least one normal memory cell has been determined to be defective. The replacement section may replace the at least one normal memory cell with the at least one redundant memory cell in accordance with whether the at least one normal memory cell is of the first memory cell type or the second memory cell type.

According to another aspect of the embodiments, the replacement section may replace the at least one normal memory cell with the at least one redundant memory cell so that the at least one normal memory cell of the first memory cell type is replaced with the at least one redundant memory cell of the first redundant memory cell type.

According to another aspect of the embodiments, the replacement section may replace the at least one normal memory cell with the at least one redundant memory cell so that the at least one normal memory cell of the second memory cell type is replaced with the at least one redundant memory cell of the second redundant memory cell type.

According to another aspect of the embodiments, the replacement section may be coupled to receive a test instruction signal. When the test instruction signal has a first test logic level, the replacement section may replace the at least one normal memory cell with the at least one redundant memory cell in accordance with whether the at least one normal memory cell is of the first memory cell type or the second memory cell type. When the test instruction signal has a second test logic level, the replacement section may replace the at least one normal memory cell with the at least one redundant memory cell independently from whether the at least one normal memory cell is of the first memory cell type or the second memory cell type.

According to another aspect of the embodiments, each of the plurality of normal memory cells and the plurality of redundant memory cells may include a memory cell capacitor for storing a data value in accordance with a storage potential. The first memory cell state may be a state where the first logic level is stored with the storage potential higher than a predetermined potential and the second memory cell state may be where the first logic level is stored with a storage potential lower than the predetermined potential.

According to another aspect of the embodiments, the replacement section may include an address scramble circuit coupled to receive an address and generate a redundant address in accordance with whether the at least one normal memory cell is of the first memory cell type or the second memory cell type.

According to another aspect of the embodiments, an operation method for a memory device including a plurality of normal memory cells and a plurality of redundant memory cells may include the step of defining at least one replacement redundant memory cell from the plurality of redundant memory cells, when at least one of the normal memory cells has been determined to be a defective normal memory cell, to replace the at least one defective normal memory cell. The plurality of normal memory cells may include a first memory cell type that may store a first logic level with a first memory cell state and a second memory cell type that may store the first logic level with a second memory cell state and the plurality of redundant memory cells may include a first redundant memory cell type that may store the first logic level with the first memory cell state and a second redundant memory cell type that may store the first logic level with the second memory cell state. The method may further include the step of providing an address such that if the address corresponds to the at least one of the normal memory cells that has been determined to be defective, the at least one replacement redundant memory cell from the plurality of memory cells is selected such that if the at least one of the normal memory cells that has been determined to be defective is of the first memory cell type, the at least one replacement redundant memory cell is of the first redundant memory cell type.

According to another aspect of the embodiments, if the at least one of the normal memory cells that has been determined to be defective is of the second memory cell type, the at least one replacement redundant memory cell may be of the second redundant memory cell type.

According to another aspect of the embodiments, a memory device may include a plurality of normal memory cells and a plurality of redundant memory cells. Normal memory cells may include a first memory cell type that may store a first logic level with a first memory cell state and a second memory cell type that may store the first logic level with a second memory cell state. Redundant memory cells may include a first redundant memory cell type that may store the first logic level with the first memory cell state and a second redundant memory cell type that may store the first logic level with the second memory cell state. A replacement section may replace at least one normal memory cell with at least one redundant memory cell when the at least one normal memory cell has been determined to be defective. In a first operating mode, the replacement section may replace the at least one normal memory cell with the at least one redundant memory cell so that normal memory cells of the first memory cell type are replaced with redundant memory cells of the first redundant memory cell type and normal memory cells of the second memory cell type are replaced with redundant memory cells of the second redundant memory cell type.

According to another aspect of the embodiments, the first operating mode may be a test mode.

According to another aspect of the embodiments, in a second operating mode, the replacement section may replace the at least one normal memory cell with the at least one redundant memory cell so that normal memory cells are replaced independently from whether the at least one normal memory cell is of the first memory cell type or the second memory cell type.

According to another aspect of the embodiments, the replacement section may be coupled to receive a plurality of addresses and provide a plurality of redundant select signals.

According to another aspect of the embodiments, the replacement section may include a redundant address decision circuit coupled to receive at least a first portion of the plurality of addresses and may provide a replacement instruction signal. An address scramble circuit may be coupled to receive at least a second portion of the plurality of addresses and the replacement instruction signal and may provide at least one redundant address.

According to another aspect of the embodiments, the address scramble circuit may include a scramble control circuit and an address mapping circuit. The control circuit may be coupled to receive at least a first one of the second portion of the plurality of addresses and the replacement instruction signal and may provide an address mapping control signal. The address mapping circuit may be coupled to receive the address mapping control signal which determines the mapping of the at least one redundant address with respect to at least a second one of the second portion of the plurality of addresses.

According to another aspect of the embodiments, the address mapping control circuit may be coupled to receive a first operating mode signal that has a first operating mode logic level when the memory device is in the first operating mode.

According to another aspect of the embodiments, the address mapping circuit may include a plurality of transfer gates coupled to receive the address mapping control signal and may provide a controllable impedance path between the at least the second one of the second portion of the plurality of addresses and the at least one redundant address.

According to another aspect of the embodiments, a plurality of word lines may be disposed in a row direction and a plurality of bit lines may be disposed in a column direction. The at least one replacement memory cell may be included in a first redundant row of redundant memory cells and the at least one defective normal memory cell may be included in a first normal row of normal memory cells.

According to another aspect of the embodiments, when the at least one replacement memory cell replaces the at least one defective normal memory cell, the first redundant row of redundant memory cells may replace the first normal row of normal memory cells and a second redundant row of redundant memory cells adjacent to the first redundant row of redundant memory cells may replace a second normal row of normal memory cells adjacent to the first normal row of normal memory cells.

According to another aspect of the embodiments, a plurality of word lines may be disposed in a row direction and a plurality of bit lines disposed in a column direction. The at least one replacement memory cell may be included in a first redundant column of redundant memory cells and the at least one defective normal memory cell may be included in a first normal column of normal memory cells According to another aspect of the embodiments, when the at least one replacement memory cell replaces the at least one defective normal memory cell, the first redundant column of redundant memory cells may replace the first normal column of normal memory cells and a second redundant column of redundant memory cells adjacent to the first redundant column of redundant memory cells may replace a second normal column of normal memory cells adjacent to the first normal column of normal memory cells.

BRIEF DESCRIPTION OF THE DRAWINGS

FIG. 3 is a schematic diagram of a memory cell array according to an embodiment.

FIG. 4 is a plan view illustrating the arrangement of memory cells according to an embodiment.

FIG. 5 is a circuit schematic diagram of an address scramble circuit according to an embodiment.

FIG. 6 is a truth table of an address scramble circuit according to an embodiment.

DETAILED DESCRIPTION OF THE EMBODIMENTS

Various embodiments of the present invention will now be described in detail with reference to a number of drawings.

First Embodiment

Figure 1:
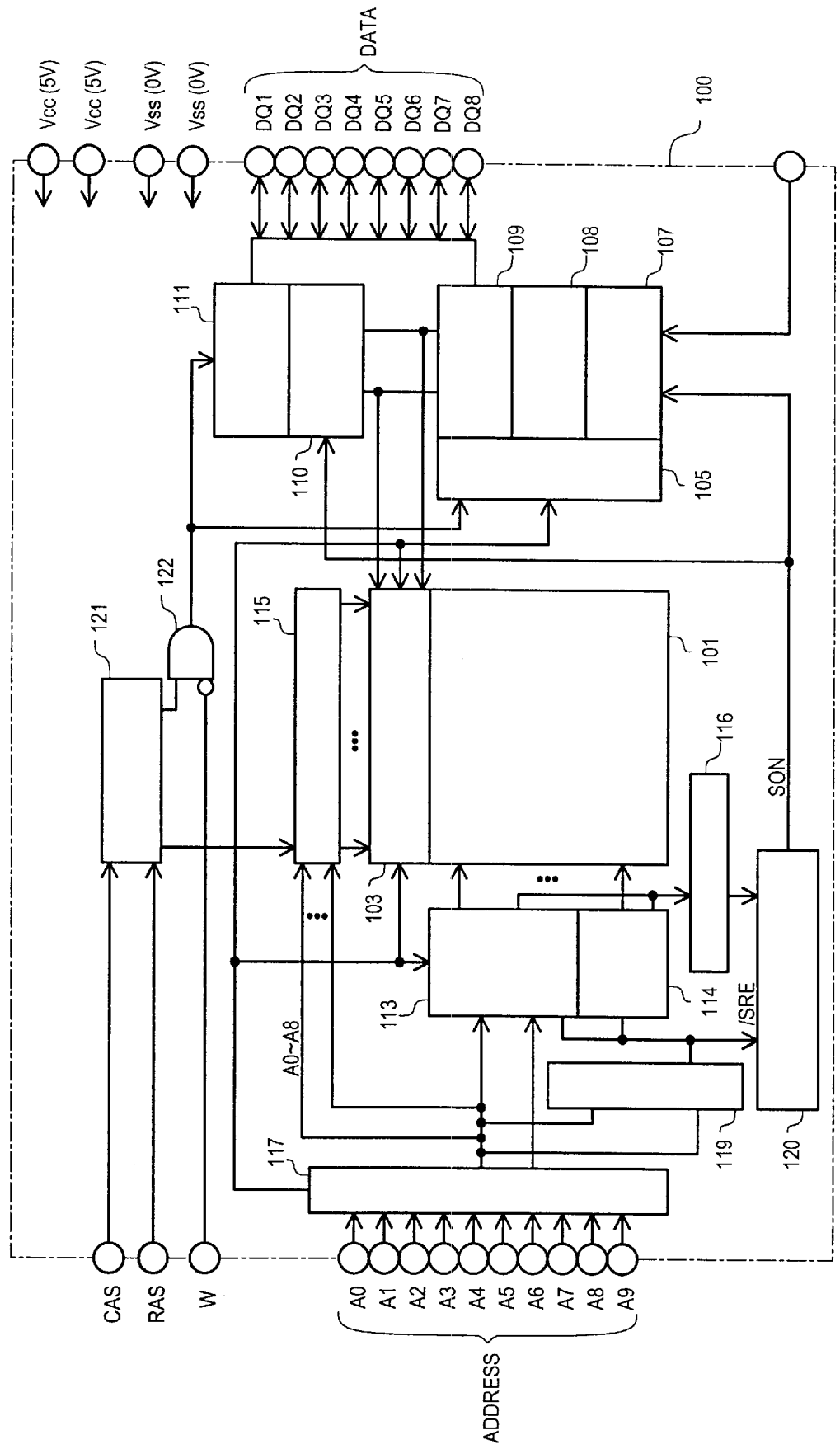
FIG. 1 is a block schematic diagram of a conventional semiconductor memory device.
Figure 2:
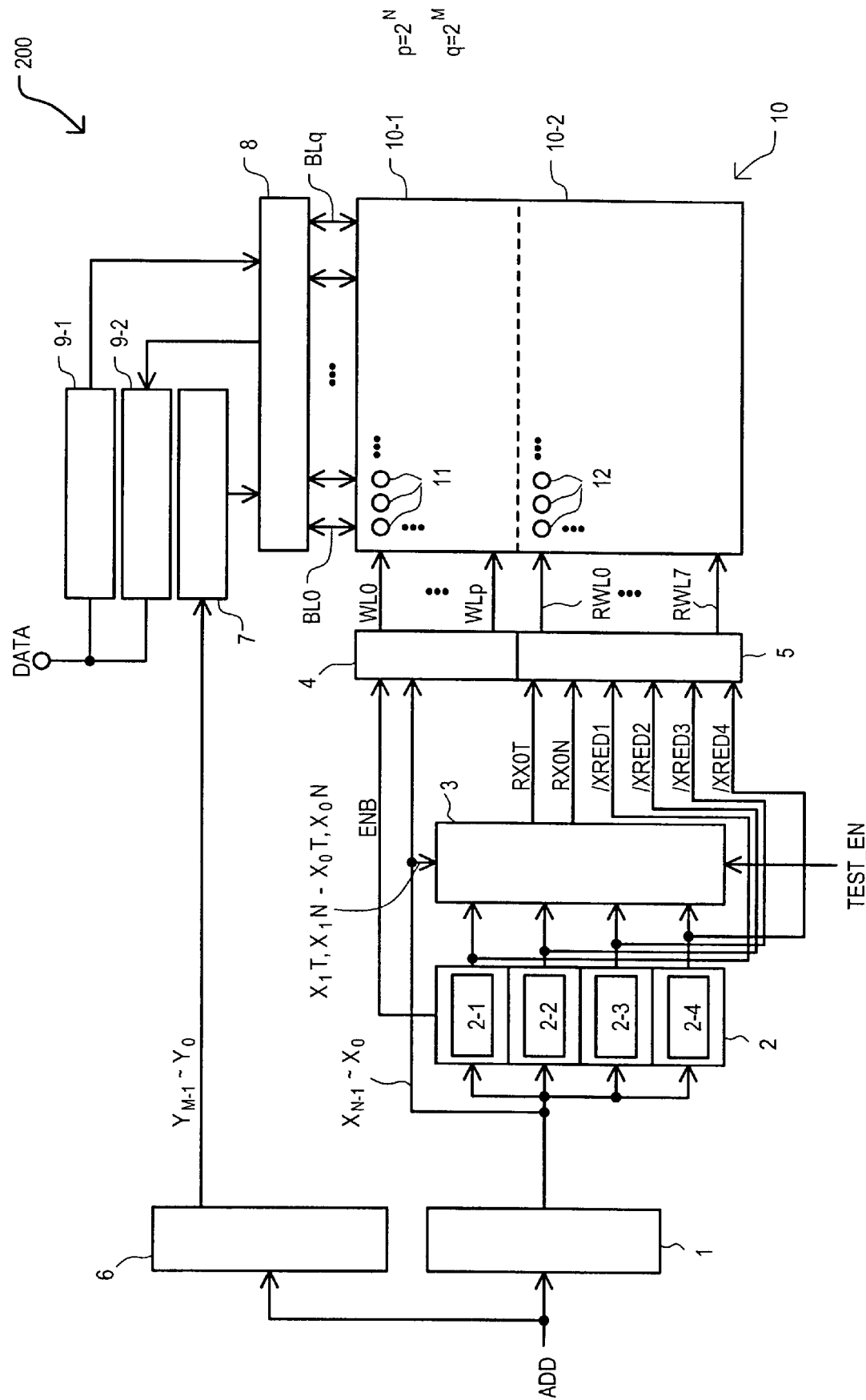
FIG. 2 is a block schematic diagram of a semiconductor memory device according to a first embodiment.

Referring now to FIG. 2, a block schematic diagram of a semiconductor memory device according to a first embodiment is set forth and given the general reference character 200. Semiconductor memory device 200 may be a dynamic random access memory (DRAM), as just one example.

Semiconductor memory device 200 may include a memory cell array 10, a row address buffer 1, a redundant address decision circuit 2, an address scramble circuit 3, a row decoder 4, a redundant row decoder 5, a sense amplifier section 8, a write amplifier section 9-1, and a read buffer 9-2.

Memory cell array 10 may include a normal memory section 10-1 and a redundant memory section 10-2. Normal memory section 10-1 may include normal memory cells 11 and redundant memory section 10-2 may include redundant memory cells 12.

Memory cell array 10 may include word lines (WL0 to WLp) and redundant word lines (RWL0 to RWL7). Herein, p may satisfy $p=2^N-1$, where N is a natural number. Word lines (WL0 to WLp) may be included in normal memory section 10-1. Each word line (WL0 to WLp) may be connected to a row of normal memory cells 11. Redundant word lines (RWL0 to RWL7) may be included in redundant memory section 10-2. Each redundant word line (RWL0 to RWLp) may be connected to a row of redundant memory cells 12.

Memory cell array 10 may include bit lines (BL0 to BLq). Herein, q may satisfy $q=2^M-1$, where M is a natural number. A column of normal memory cells 11 and redundant memory cells 12 may be connected to bit lines (BL0 to BLq). It is noted that each bit line (BL0 to BLq) may include a complementary bit line pair.

Semiconductor memory device 200 may receive an address signal ADD. The address signal ADD may correspond to a specific normal memory cell 11 that is to be accessed, hereinafter referred to as specific memory cell.

Address signal ADD may specify row addresses ($X_{N-1}$ to $X_0$) and column addresses ($Y_{M-1}$ to $Y_0$), which may be received in a time multiplexed manner. Row addresses ($X_{N-1}$ to $X_0$) and column addresses ($Y_{M-1}$ to $Y_0$) may be referred to simply as row addresses X and column addresses Y, respectively. Row address X may include N row address bits ($X_{N-1}$ to $X_0$) and column addresses ($Y_{M-1}$ to $Y_0$) and column address Y may include M column address bits ($Y_{M-1}$ to $Y_0$).

Each word line (WL0 to WLp) may be selected by a unique value for row addresses X.

Likewise, each bit line (BL0 to BLq) may be selected by a unique value for column addresses Y. In this way, a memory cell 11 may be selected in accordance with a particular combination of row addresses X and column addresses Y.

Row address buffer 1 may generate a row address X based on a received address ADD. Redundant address decision circuit 2, address scramble circuit 3, row decoder 4, and redundant row decoder 5 may collectively operate to select a predetermined normal word line (WL0 to WLp) or redundant word line (RWL0 to RWL7) in accordance with the received value of row address X.

Defective normal word lines (WL0 to WLp) may be replaced with redundant word line (RWL0 to RWL7). In this case, when addressed, a defective normal word line (WL0 to WLp) may not be enabled and a redundant word line (RWL0 to RWL7) may be enabled instead.

Column address buffer 6 may generate a column address Y based on a received address ADD. Column decoder 7 may receive column address Y and may select a bit line (BL0 to BLq) based on the column address Y value.

By selecting a predetermined word line (WL0 to WLp) or redundant word line (RWL0 to RWL7) and a predetermined bit line (BL0 to BLq) in accordance with values of a row address X and column address Y, a normal memory cell 11 or redundant memory cell 12 may be selected.

Sense amplifier section 8, write amplifier section 9-1, and read amplifier section 9-2 may operate to write or read data from the selected memory cell. During a write, write amplifier section 9-1 may receive data from data signal line DATA and provide data to sense amplifier section 8. Sense amplifier section 8 may then write data into a selected memory cell. During a read, sense amplifier section 8 may receive and amplify data from a selected memory cell and provide data to read amplifier section 9-2. Read amplifier section may provide data to data signal line DATA. In this way, data may be read from or written to a selected memory cell. Although not shown, a plurality of memory cell may be selected in parallel so that a plurality of data may be essentially simultaneously written or read.

Referring now to FIG. 3, a schematic diagram of memory cell array 8 is set forth according to an embodiment.

Memory cell array 10 may include normal memory section 10-1 and redundant memory section 10-2. Normal memory section may include normal memory cells 11. Normal memory cells 11 may be connected to normal word lines (WL0 to WLp) in a row direction and bit lines (BL0 to BLq) in a column direction. In order to avoid unduly cluttering the figure, only normal word lines (WL0 to WL7) and bit lines (BL0 and BL1) are illustrated. Redundant memory section 10-2 may include redundant memory cells 12. Redundant memory cells may be connected to redundant word lines (RWL0 to RWL7) in a row direction and bit lines (BL0 to BLq) in a column direction.

Each bit line (BL0 to BLq) may include complementary bit line pairs. For example, bit line BL0 may include a true bit line BL0T and a complement bit line BL0N. Likewise, as illustrated bit line BL1 may include a true bit line BL1T and a complement bit line BL1N. Normal memory cells 11 and redundant memory cells 12 may include two cell types classified as true data memory cells and complement data memory cells. True data memory cells are illustrated as non-hatched circles and may be connected to a true bit line. Complement data memory cells are illustrated as hatched circles and may be connected to a complement bit line.

A true data memory cell may store logic one data by holding a high potential $V_H$, where high potential $V_H$ may be greater than a bit line reference potential. Bit line reference potential may be VDD/2, as just one example, where VDD may be a value of a power supply potential. A true data memory cell may store logic zero data by holding a low potential $V_L$, where low potential $V_L$ may be lower than a bit line reference potential. A complement data memory cell may store logic one data by holding a low potential $V_L$, where low potential $V_L$ may be lower than a bit line reference potential. A complement data memory cell may store logic zero data by holding a high potential $V_H$, where high potential $V_H$ may be greater than a bit line reference potential. It is noted that high potential $V_H$ and low potential $V_L$ may be any potential sufficient to provide a large enough data signal on a respective bit line (BL0 to BLq).

Bit lines (BL0 to BLq) may be connected to a respective sense amplifier (8-0 to 8-q) in sense amplifier section 8. In FIG. 3, only sense amplifiers (8-0 and 8-1) are illustrated to avoid unduly cluttering the figure. For example, true bit line BL0T may be connected to a true input terminal of sense amplifier 8-0 and complement bit line BL0N may be connected to a complement input terminal of sense amplifier 8-0.

In a bit line (BL0 to BLq), a true bit line may carry true data and a complement bit line may carry complement data. For example, considering bit line BL0, true bit line BL0T may carry true data have the same logic value as data written or read from semiconductor memory device 200 and complement bit line BL0N may carry complementary data having an inverted logic value as compared to data written or read from semiconductor memory device. True data memory cells may be connected to true bit lines and complement data memory cells may be connected to complement bit lines.

A particular word line (WL0 to WLp) may have only true data memory cells or may have only complement data memory cells connected among normal memory cells 11. Likewise, a particular redundant word line (RWL0 to RWL7) may have only true data memory cells or may have only complement data memory cells connected among redundant memory cells 12. A normal word line (WL0 to WLp) to which only true data memory cells are connected may be referred to as a true normal word line. A normal word line (WL0 to WLp) to which only complement data memory cells are connected may be referred to as a complement normal word line. A redundant word line (RWL0 to RWL7) to which only true data memory cells are connected may be referred to as a true redundant word line. A redundant word line (RWL0 to RWL7) to which only complement data memory cells are connected may be referred to as a complement redundant word line.

When viewed from the sense amplifier section 8, normal word lines (WL0 to WLp) may be arranged in a repeated order of complement normal word line, true normal word line, true normal word line, and complement normal word line. Likewise, when viewed from the sense amplifier section 8, redundant word lines (RWL0 to RWL7) may be arranged in a repeated order of complement redundant word line, true redundant word line, true redundant word line, and complement redundant word line.

It is noted that normal memory cells 11 and redundant memory cells 12 may be arranged in a pattern of two true data memory cells, two complement data memory cells, etc. The reason for this may be illustrated with reference to FIG. 4.

Referring now to FIG. 4, a plan view illustrating the arrangement of memory cells according to an embodiment is set forth.

FIG. 4 illustrates two memory cells 11. Two memory cells 11 may share a bit line contact 15. In this way, area per memory cell may be reduced. However, by sharing a bit line contact 15, it is typical that the two memory cells 11 are either both true data memory cells or complement data memory cells.

Referring once again to FIG. 3, normal word lines (WL0 to WL7) may be arranged into normal word line pairs (13-1 to 13-4). Each normal word line pair (13-1 to 13-4) may include one true normal word line and one complement normal word line. For example, normal word line pair 13-1 may include complement normal word line WL0 and true normal word line WL1. Normal word line pair 13-2 may include true normal word line WL2 and complement normal word line WL3. In the same fashion, normal word line pair (13-$t$) may include true normal word line WL($2t$-2) and complement normal word line WL($2t$-1), where t is an integer greater than or equal to one and smaller than $2^{N-1}$.

One normal word line pair (13-1 to 13-$t$) may be selected by row address bits ($X_{N-1}$, $X_{N-2}$, . . . , $X_1$). Least significant row address bit $X_0$ may select one of the selected normal word line pair (13-1 to 13-$t$).

Normal word line pairs (13-1 to 13-$t$) may be further classified into a first normal word line pair and a second normal word line pair. A first normal word line pair may have a complement normal word line closer to sense amplifier section 8 than a true normal word line is closer to sense amplifier section 8. For example, normal word line pairs (13-1 and 13-3) may be first normal word line pairs. A second normal word line pair may have a true normal word line closer to sense amplifier section 8 than a complement normal word line is closer to sense amplifier section 8. For example, normal word line pairs (13-2 and 13-4) may be second normal word line pairs.

Row address bit $X_1$ may indicate whether a certain normal word line pair (13-1 to 13-$t$) is a first word line pair or a second word line pair. For example, a word line pair (13-1 to 13-$t$) having an address where row address bit $X_1$ is "0" may be a first word line pair and a word line pair (13-1 to 13-$t$) having an address where row address bit $X_1$ is "1" may be a second word line pair.

As mentioned earlier, a redundant word line (RWL0 to RWL7) to which only true data memory cells are connected may be referred to as a true redundant word line. A redundant word line (RWL0 to RWL7) to which only complement data memory cells are connected may be referred to as a complement redundant word line.

When viewed from the sense amplifier section 8, redundant word lines (RWL0 to RWL7) may be arranged in a repeated order of complement redundant word line, true redundant word line, true redundant word line, and complement redundant word line. Redundant word lines (RWL0, RWL3, RWL4, and RWL7) may be complement redundant word lines and redundant word lines (RWL1, RWL2, RWL5, and RWL6) may be true redundant word lines.

Redundant word lines (RWL0 to RWL7) may be arranged into redundant word line pairs (14-1 to 14-4). Each redundant word line pair (14-1 to 14-4) may include one true normal word line and one complement normal word line. For example, redundant word line pair 14-1 may include complement redundant word line RWL0 and true redundant word line RWL1. Redundant word line pair 14-2 may include true redundant word line RWL2 and complement redundant word line RWL3. In the same fashion, redundant word line pairs (14-3 and 14-4) may include true redundant word line (RWL5 and RWL6) and complement redundant word line (RWL4 and RWL7), respectively.

Redundant section row address RX may be used to define redundant word lines (RWL0 to RWL7). Redundant section row address RX may include redundant section row address bits ($RX_2$, $RX_1$, and $RX_0$). Each redundant word line pair (14-1 to 14-4) may be selected by a unique address for row address bits ($RX_2$ and $RX_1$). Further more, one of two redundant word lines in redundant word line pairs (14-1 to 14-4) may be selected by least significant redundant row address bit $RX_0$. Redundant word lines (RWL0, RWL2, RWL4, and RWL6) may be selected with least significant redundant row address bit $RX_0$ having a "0". Redundant word lines (RWL1, RWL3, RWL5, and RWL7) may be selected with least significant redundant row address bit $RX_0$ having a "1".

Redundant word line pairs (14-1 to 14-4) may be further classified into a first redundant word line pair and a second redundant word line pair. A first redundant word line pair may have a complement redundant word line closer to sense amplifier section 8 than a true redundant word line is closer to sense amplifier section 8. For example, redundant word line pairs (14-1 and 14-3) may be first redundant word line pairs. A second redundant word line pair may have a true redundant word line closer to sense amplifier section 8 than a complement redundant word line is closer to sense amplifier section 8. For example, redundant word line pairs (14-2 and 14-4) may be second redundant word line pairs.

When it is determined through a characterization test that a normal memory cell 11 is defective, a redundant word line (RWL0 to RWL7) may be used to replace a normal word line (WL0 to WLp) that contains the defective normal memory cell 11. In the embodiment illustrated in FIG. 2, when a normal word line (WL0 to WLp) includes a defective memory cell 11, a normal word line pair (13-1 to 13-$t$) that includes the normal word line (WL0 to WLp) with a defective memory cell 11 may be replaced with a redundant word line pair (14-1 to 14-4). In this way, normal word lines (WL0 to WLp) may be replaced in pairs corresponding to a normal word line pairs (13-1 to 13-$t$) being replaced by redundant word line pair (14-1 to 14-4).

In the foregoing, a normal word line pair (13-1 to 13-$t$) that includes as least one defective memory cell 11 may be referred to as a defective normal word line pair. A redundant word line pair (14-1 to 14-4) used to replace a defective normal word line pair may be referred to as a replacement redundant word line pair.

One of the word lines in the defective normal word line pair may be a true normal word line and the other word line in the defective normal word line pair may be a complement normal word line. Likewise, one of the word lines in the replacement redundant word line pair may be a true redundant word line and the other word line in the replacement redundant word line pair may be a complement redundant word line.

In semiconductor memory device 200 as illustrated in FIG. 2, address scramble circuit 3 may receive a test instruction signal TEST_EN.

When test instruction signal TEST_EN is high, the replacement redundant word line pair may be mapped so that a true redundant word line may replace a true normal word line of defective normal word line pair and a complement redundant word line may replace a complement normal word line of defective normal word line pair.

To illustrate this, consider a first case in which normal word line pair 13-1 is a defective normal word line pair and redundant word line pair 14-1 is a replacement redundant word line pair. Defective word line pair 13-1 may include at least one normal memory cell 11 that is defective. Defective word line pair 13-1 may include normal word line WL0 that is a complement normal word line and normal word line WL1 that is a true normal word line. Replacement redundant word line pair 14-1 may include redundant word line RWL0 that is a complement redundant word line and redundant word line RWL1 that is a true redundant word line. In this case, normal word line WL0 (a complement normal word line) may be replaced by redundant word line RWL0 (a complement redundant word line) and normal word line WL1 (a true word line) may be replaced by redundant word line RWL1 (a true redundant word line). In this case, the order of defective normal word line pair 13-1 (complement normal word line—true normal word line) with respect to sense amplifier section 8 may be the same as an order of replacement redundant word line pair 14-1 (complement redundant word line-true redundant word line).

Alternatively, consider a second case in which normal word line pair 13-1 is a defective normal word line pair and redundant word line pair 14-2 is a replacement redundant word line pair. Defective word line pair 13-1 may include at least one normal memory cell 11 that is defective. Defective word line pair 13-1 may include normal word line WL0 that is a complement normal word line and normal word line WL1 that is a true normal word line. Replacement redundant word line pair 14-2 may include redundant word line RWL2 that is a true redundant word line and redundant word line RWL3 that is a complement redundant word line. In this case, normal word line WL0 (a complement normal word line) may be replaced by redundant word line RWL3 (a complement redundant word line) and normal word line WL1 (a true word line) may be replaced by redundant word line RWL2 (a true redundant word line). It should be noted that in this second case, defective word line pair 13-1 may have a complement normal word line WL0 that is closer to sense amplifier section 8 than true normal word line WL1 is close to sense amplifier section 8. However, replacement redundant word line pair 14-2 may have a complement redundant word line RWL3 that is farther from sense amplifier section 8 than true redundant word line RWL2 is from sense amplifier section 8. Therefore, the order of defective normal word line pair 13-1 (complement normal word line—true normal word line) with respect to sense amplifier section 8 may be the opposite as an order of replacement redundant word line pair 14-2 (true redundant word line—complement redundant word line).

However, in both the first case and the second case, when test instruction signal TEST_EN is high, a true normal memory cell may be replaced by a true redundant memory cell and a complement normal memory cell may be replaced by a complement redundant memory cell. In this way, potential levels in redundant memory cells 12 may remain essentially the same for a particular data value as potential levels would be in normal memory cells 11. By doing so, tests may apply substantially the same stress on a memory cell being tested without regard as to whether a normal memory cell 11 or a redundant memory cell 12 is being tested and integrity of tests results may be improved.

However, when test instruction signal TEST_EN is low, address scramble circuit 3 may not modify the mapping of redundant addresses RX and a true or complement normal word line (WL0 to WLp) may be replaced by a redundant word line (RWL0 to RWL7) without regard as to whether it is a true or complement redundant word line. Thus, potential levels in redundant memory cells 12 may not remain the same for a particular data value as potential levels would be in normal memory cells 11.

Referring once again to FIG. 2, the operation for semiconductor memory device 200 when a normal word line (WL0 to WLp) and a redundant word line (RWL0 to RWL7) is selected will now be described.

Row address buffer 1 may receive an address signal ADD and generate a row address ($X_{N-1}$ to $X_0$). Redundant address decision circuit 2 may receive row address ($X_{N-1}$ to $X_0$).

Redundant address decision circuit 2 may store up to four replacement row addresses in redundant address storage circuits (2-1 to 2-4). Replacement address decision circuit 2 may include programmable elements for storing replacement row addresses, as just one example. Replacement row addresses may include stored values for row addresses ($X_{N-1}$ to $X_1$). Redundant address decision circuit 2 may generate an enable signal and replacement instruction signals (/XRED1 to XRED4) in response to whether or not any of replacement row addresses stored in redundant address storage circuits (2-1 to 2-4) match a value of the received row addresses ($X_{N-1}$ to $X_1$).

When row addresses ($X_{N-1}$ to $X_1$) of row address X do not match any of replacement row addresses stored in redundant address storage circuits (2-1 to 2-4), a normal word line (WL0 to WLp) may be selected. In this case, redundant address decision circuit 2 may output enable signal ENB having a high level. Row decoder 4 may receive enable signal ENB having a high level and select a normal word line (WL0 to WLp) corresponding to a value of received row addresses ($X_{N-1}$ to $X_0$).

Also, when row addresses ($X_{N-1}$ to $X_1$) of row address X do not match any of replacement row addresses stored in redundant address storage circuits (2-1 to 2-4), all of replacement instruction signals (/XRED1 to /XRED4) may have a high level. When all of replacement instruction signals (/XRED1 to /XRED4) are at a high level, redundant row decoder 5 may not enable any of redundant word lines (RWL0 to RWL7).

Accordingly, when row addresses ($X_{N-1}$ to $X_1$) of row address X do not match any of replacement row addresses stored in redundant address storage circuits (2-1 to 2-4), a normal word line (WL0 to WLp) corresponding to a value of received row addresses ($X_{N-1}$ to $X_0$) may be selected and a redundant word line (RWL0 to RWL7) may not be selected.

However, when row addresses ($X_{N-1}$ to $X_1$) of row address X do match one of replacement row addresses stored in redundant address storage circuits (2-1 to 2-4), a redundant word line (RWL0 to RWL7) may be selected.

When row addresses ($X_{N-1}$ to $X_1$) of row address X do match one of replacement row addresses stored in redundant address storage circuits (2-1 to 2-4), redundant address decision circuit 2 may output enable signal ENB having a low level. When enable signal ENB has a low level, row decoder 4 may be disabled and a word line (WL0 to WLp) may not be selected in normal memory section 10-1.

Redundant address decision circuit 2 may output a replacement instruction signal (/XRED1 to /XRED4), that corresponds with the redundant address storage circuit (2-1 to 2-4) that stores the matching row address, having a low level. However, the other three of replacement instruction signals (/XRED1 to /XRED4) may remain at a high level. For example, when row addresses ($X_{N-1}$ to $X_1$) of row address X match a replacement row addresses stored in redundant address storage circuit 2-1, replacement instruction signal /XRED1 may become low, while replacement instruction signals (/XRED2 to /XRED4) may remain high.

Address scramble circuit 3 may receive replacement instruction signals (/XRED1 to /XRED4) and complementary row addresses (X0T-X0N and X1T-X1N). Address scramble circuit 3 may map complementary row addresses (X0T and X0N) into complementary redundant row addresses (RX0T and RX0N) in accordance with a logic level of test instruction signal TEST_EN, replacement instruction signals (/XRED1 to /XRED4), and complementary row addresses (X0T-X0N and X1T-X1N). Complementary row addresses (X0T-X0N and X1T-X1N) may correspond to row address bits ($X_1$ and $X_0$), respectively.

Redundant row decoder 5 may select a redundant word line (RWL0 to RWL7) based on received replacement instruction signals (/XRED1 to /XRED4) and complementary redundant row addresses (RX0T and RX0N).

Replacement instruction signals (/XRED1 to /XRED4) may correspond to redundant word line pairs (14-1 to 14-4), respectively.

When one of replacement instruction signals (/XRED1 to /XRED4) are at a low level, a respective redundant word line pair (14-1 to 14-4) may be enabled. In the enabled redundant word line pair (14-1 to 14-4), a particular word line (RWL0 to RWL7) may be selected based on values of complementary redundant row addresses (RX0T and RX0N). Complementary redundant row addresses (RX0T and RX0N) may correspond to a true value and complementary value, respectively, for redundant row address RX0. Redundant row address RX0 may be a least significant bit redundant row address.

Referring once again to FIG. 3, when redundant row address RX0 is at a low level, one of redundant word lines (RWL0, RWL2, RWL4, and RWL6) may be enabled. When redundant row address RX0 is at a high level, one of redundant word lines (RWL1, RWL3, RWL5, and RWL7) may be enabled.

When test instruction signal TEST_EN is low, address scramble circuit 3 may provide RX0=$X_0$. In this case, a defective word line (WL0 to WLp) may be replaced by any of redundant word lines (RWL0 to RWL7) without a consideration as to whether the defective word line (WL0 to WLp) is a true normal word line or a complement normal word line.

However, when test instruction signal TEST_EN is high, address scramble circuit 3 may provide redundant row address RX0 such that a defective normal word line that is a true normal word line may be replaced with a replacement redundant word line that is a true redundant word line. Likewise, a defective normal word line that is a complement normal word line may be replaced with a replacement redundant word line that is a complement redundant word line.

The mapping of redundant row address RX0 by address scramble circuit 3 when test instruction signal TEST_EN is high will now be described in detail.

When a normal word line (WL0 to WLp) includes a defect, a replacement redundant word line pair (14-1 to 14-4) may be used to replace a defective normal word line pair (13-1 to 13-*t*) that includes the defective normal word line (WL0 to WLp). Thus, when a received row address X corresponds to the defective normal word line pair (13-1 to 13-*t*), a replacement word line pair (14-1 to 14-4) may be enabled as discussed previously.

In this case, address scramble circuit 3 may map redundant row address RX0 in accordance with whether the defective normal word line pair (13-1 to 13-*t*) is a first normal word line pair or second normal word line pair and replacement redundant word line pair (14-1 to 14-4**) is a first redundant word line pair or a second redundant word line pair, as defined earlier.

When defective normal word line pair (13-1 to 13-*t*) is a first normal word line pair and replacement redundant word line pair (14-1 to 14-4) is a first redundant word line pair or defective normal word line pair (13-1 to 13-*t*) is a second normal word line pair and replacement redundant word line pair (14-1 to 14-4) is a second redundant word line pair, redundant row address RX0 may be defined as RX0=$X_0$ by address scramble circuit 3.

In this case, defective normal word line pair (13-1 to 13-*t*) and replacement redundant word line pair (14-1 to 14-4) may have a similar structure. For example, defective normal word line pair (13-1 to 13-*t*) may have a true normal word line-complement normal word line structure when viewed from sense amplifier circuit 8 and replacement redundant word line pair (14-1 to 14-4) may have a true redundant word line-complement redundant word line structure when viewed from sense amplifier circuit 8. Alternatively, defective normal word line pair (13-1 to 13-*t*) may have a complement normal word line-true normal word line structure when viewed from sense amplifier circuit 8 and replacement redundant word line pair (14-1 to 14-4) may have a complement redundant word line-true redundant word line structure when viewed from sense amplifier circuit 8**.

An example of the above-mentioned situation would be when a defective normal word line pair 13-1 is replaced with a replacement redundant word line pair 14-1. Another example would be when a defective normal word line pair 13-2 is replaced with a replacement redundant word line pair 14-4, as but two examples.

However, when defective normal word line pair (13-1 to 13-*t*) is a first normal word line pair and replacement redundant word line pair (14-1 to 14-4) is a second redundant word line pair or defective normal word line pair (13-1 to 13-*t*) is a second normal word line pair and replacement redundant word line pair (14-1 to 14-4) is a first redundant word line pair, redundant row address RX0 may be defined as RX0=inv($X_0$) by address scramble circuit 3. In this case inv($X_0$) may be the logical complement of $X_0$.

Address scramble circuit 3 may determine whether a replacement redundant word line pair (14-1 to 14-4) is a first replacement redundant word line pair (14-1 or 14-3) or a second replacement redundant word line pair (14-2 or 14-4) with the aid of replacement instruction signals (/XRED1 to /XRED4). Address scramble circuit 3 may generate complementary redundant row address signals (RX0T and RX0N) on the basis of row address bits ($X_1$ and $X_0$) and replacement instruction signals (/XRED1 to /XRED4).

In this way, semiconductor memory device 200 may provide an assurance that when a defect occurs, a true normal word line may be replaced by a true redundant word line and a complement normal word line may be replaced by a complement redundant word line when a test mode is implemented. This may provide a test mode in which test integrity on products in which redundancy is being implemented may be improved.

Referring now to FIG. 5, a circuit schematic diagram of an address scramble circuit according to an embodiment is set forth. Address scramble circuit of FIG. 5 may be address scramble circuit 3.

Address scramble circuit 3 may receive a test instruction signal TEST_EN, complementary row address bits (X1N-

X1T and X0N-X0T), and replacement instruction signals (/XRED1 to /XRED4) as inputs and may generate complementary redundant row address signals (RX0T and RX0N).

Address scramble circuit 3 may include NAND gates (31 to 35), inverters (36, 41 and 42), and transfer gates (37 to 40).

NAND gate 31 may receive replacement instruction signals (/XRED2 and /XRED4) as inputs and may output a signal N1. NAND gate 32 may receive replacement instruction signals (/XRED1 and /XRED3) as inputs and may output a signal N2. NAND gate 33 may receive test instruction signal TEST_EN, row address bit X1N, and signal N1 as inputs and may output signal N3. NAND gate 34 may receive test instruction signal TEST_EN, row address bit X1T, and signal N2 as inputs and may output signal N4.

NAND gate 35 may receive signals (N3 and N4) as inputs and may output signal N5. Inverter 36 may receive signal N5 as an input and output signal N6.

Signals (N5 and N6) may be provided as inputs to control transfer gates (37 to 40).

Transfer gate 37 may include a p-type insulated gate field effect transistor (IGFET) 37-1 and a n-type IGFET 37-2 arranged in parallel to provide a controllable impedance path between row address signal X0N and redundant row address signal RX0N. P-type IGFET 37-1 may receive signal N5 at a control gate and may have a first source/drain connected to receive row address signal X0N and second source/drain connected to redundant row address signal RX0N. N-type IGFET 37-2 may receive signal N6 at a control gate and may have a first source/drain connected to receive row address signal X0N and second source/drain connected to redundant row address signal RX0N.

Transfer gate 38 may include a p-type IGFET 38-1 and an n-type IGFET 38-2 arranged in parallel to provide a controllable impedance path between an output of inverter 41 and redundant row address signal RX0N. Inverter 41 may receive row address signal X0N as an input. P-type IGFET 38-1 may receive signal N6 at a control gate and may have a first source/drain connected to receive row address signal X0N through inverter 41 and second source/drain connected to redundant row address signal RX0N. N-type IGFET 38-2 may receive signal N5 at a control gate and may have a first source/drain connected to receive row address signal X0N through inverter 41 and second source/drain connected to redundant row address signal RX0N.

Transfer gate 39 may include a p-type IGFET 39-1 and a n-type IGFET 39-2 arranged in parallel to provide a controllable impedance path between row address signal X0T and redundant row address signal RX0T. P-type IGFET 39-1 may receive signal N5 at a control gate and may have a first source/drain connected to receive row address signal X0T and second source/drain connected to redundant row address signal RX0T. N-type IGFET 39-2 may receive signal N6 at a control gate and may have a first source/drain connected to receive row address signal X0T and second source/drain connected to redundant row address signal RX0T.

Transfer gate 40 may include a p-type IGFET 40-1 and an n-type IGFET 40-2 arranged in parallel to provide a controllable impedance path between an output of inverter 42 and redundant row address signal RX0T. Inverter 42 may receive row address signal X0T as an input. P-type IGFET 40-1 may receive signal N6 at a control gate and may have a first source/drain connected to receive row address signal X0T through inverter 42 and second source/drain connected to redundant row address signal RX0T. N-type IGFET 40-2 may receive signal N5 at a control gate and may have a first source/drain connected to receive row address signal X0T through inverter 42 and second source/drain connected to redundant row address signal RX0T.

Referring now to FIG. 6, a truth table of address scramble circuit 3 according to an embodiment is set forth.

The truth table of FIG. 6 illustrates logic states for internal nodes of address scramble circuit 3 as well as logic states for redundant row address signals (RX0N and RX0T) when defective normal word line pair 13-1 is replaced with either replacement redundant word line pair 14-1 or replacement redundant word line pair 14-2 and test instruction signal TEST_EN is at a high level.

First, let us consider the case when defective normal word line pair 13-1 is replaced with replacement redundant word line pair 14-1 and semiconductor memory device 200 is operating in a mode in which test instruction signal TEST_EN is high.

Referring now to FIG. 2, in this case, a stored address in row address storage circuit 2-1 may have a value for row addresses ($X_N$, . . . , $X_1$) that may correspond with the addressing of defective normal word line pair 13-1. Thus, when row addresses ($X_N$, . . . , $X_1$) are received having the stored address value, redundant address decision circuit 2 may bring replacement instruction signal /RED1 to a low level while replacement instruction signals (/RED2 to /RED4) may remain at a high level.

Row address bit $X_1$ may be a "0". With row address bit $X_1$ being a "0", complementary row address bits (X1N and X1T) may be high and low, respectively.

Referring now to FIG. 6 in conjunction with FIG. 5, with replacement instruction signals (/XRED2 and /XRED4) being high, NAND gate 31 may output signal N1 having a low level. However, with replacement instruction signal /XRED1 being low, NAND gate 32 may output signal N2 having a high level.

With node N1 low, NAND gate 33 may output a signal N3 having a high level. With complementary row address bit X1T being at a low level, NAND gate 34 may output a signal N4 having a high level. With signals (N3 and N4) being high, NAND gate 35 may output a signal N5 having a low level and inverter 36 may output a signal N6 having a high level.

With signal N5 being low and signal N6 being high, transfer gates (37 and 39) may be turned on and transfer gates (38 and 40) may be turned off. In this way, complementary redundant row address bits (RX0N and RX0T) may have the same logic level as complementary row address bits (X0N and X0T), respectively. Thus, redundant row address $RX_0$ may be brought in coincidence with row address $X_0$.

In this example, when normal word line WL0 out of defective normal word line pair 13-1 is addressed, row address $X_0=0$. With row address $X_0=0$, redundant row address $RX_0=0$ and redundant word line RWL0 out of replacement defective word line pair 14-1 may be selected to replace normal word line WL0. In this way, normal word line WL0 that is a complement normal word line may be replaced by redundant word line RWL0 that is a complement redundant word line.

However, when normal word line WL1 out of defective normal word line pair 13-1 is addressed, row address $X_0=1$. With row address $X_0=1$, redundant row address $RX_0=1$ and redundant word line RWL1 out of replacement defective word line pair 14-1 may be selected to replace normal word line WL1. In this way, normal word line WL1 that is a true normal word line may be replaced by redundant word line RWL1 that is a true redundant word line.

Now, let us consider the case when defective normal word line pair 13-1 is replaced with replacement redundant word line pair 14-2 and semiconductor memory device 200 is operating in a mode in which test instruction signal TEST_EN is high. In this case, normal word line WL0 may be replaced with redundant word line RWL3 and normal word line WL1 may be replaced with redundant word line RWL2.

Referring now to FIG. 2, in this case, a stored address in row address storage circuit 2—2 may have a value for row addresses ($X_N$, ..., $X_1$) that may correspond with the addressing of defective normal word line pair 13-1. Thus, when row addresses ($X_N$, ..., $X_1$) are received having the stored address value, redundant address decision circuit 2 may bring replacement instruction signal /RED2 to a low level while replacement instruction signals (/RED1, RED3, and /RED4) may remain at a high level.

Row address bit $X_1$ may be a "0". With row address bit $X_1$ being a "0", complementary row address bits (X1N and X1T) maybe high and low, respectively.

Referring now to FIG. 6 in conjunction with FIG. 5, with replacement instruction signals (/XRED1 and /XRED3) being high, NAND gate 32 may output signal N2 having a low level. However, with replacement instruction signal /XRED2 being low, NAND gate 31 may output signal N1 having a high level.

With node N2 low, NAND gate 34 may output a signal N4 having a high level. With test instruction signal TEST_EN, complementary row address bit X1N, and node N1, all being at a high level, NAND gate 33 may output a signal N3 having a low level. With signal N3 being low, NAND gate 35 may output a signal N5 having a high level and inverter 36 may output a signal N6 having a low level.

With signal N5 being high and signal N6 being low, transfer gates (38 and 40) may be turned on and transfer gates (37 and 39) may be turned off. In this way, complementary redundant row address bits (RX0N and RX0T) may have an inverted logic level as compared to complementary row address bits (X0N and X0T), respectively. Thus, redundant row address $RX_0$ may be inverted with respect to row address $X_0$.

In this example, when normal word line WL0 out of defective normal word line pair 13-1 is addressed, row address $X_0=0$. With row address $X_0=0$, redundant row address $RX_0=1$ and redundant word line RWL3 out of replacement defective word line pair 14-2 may be selected to replace normal word line WL0. In this way, normal word line WL0 that is a complement normal word line may be replaced by redundant word line RWL3 that is a complement redundant word line.

However, when normal word line WL1 out of defective normal word line pair 13-1 is addressed, row address $X_0=1$. With row address $X_0=1$, redundant row address $RX_0=0$ and redundant word line RWL2 out of replacement defective word line pair 14-2 may be selected to replace normal word line WL1. In this way, normal word line WL1 that is a true normal word line may be replaced by redundant word line RWL2 that is a true redundant word line.

As described previously, when test instruction signal TEST_EN is at a high level, address scramble circuit 3 may define redundant address $RX_0$ such that a normal word line in a defective word line pair may be replaced by a redundant word line in a redundant word line pair so that a true normal word line may be replaced by a true redundant word line and a complement normal word line may be replaced by a complement redundant word line.

When any of replacement instruction signals (/XRED1 to /XRED4) is at a low level, redundant row decoder 5 may select a redundant word line (RWL0 to RWL7) on the basis of redundant row address bit $RX_0$ and replacement instruction signals (/XRED1 to /XRED4). In this way, a redundant word line (RWL0 to RWL7) may be selected and redundant memory cells 13 connected to the selected redundant word line (RWL0 to RWL7) may be selected and may have stored data amplified (sensed) by sense amplifier section 8. Any one of selected redundant memory cells 13 may be accessed by column decoder 7 on the basis of a column address ($Y_{M-1}$, ..., $Y_0$) generated by column address buffer 6.

In accordance with the first embodiment, in a mode of operation (TEST_IN is high), it may be assured that a normal word line that is a true normal word line may be replaced with a redundant word line that is a true redundant word line and a normal word line that is a complement normal word line may be replaced with a redundant word line that is a complement redundant word line. In this way, it may be assured that a true normal memory cell may be replaced by a true redundant memory cell and a complement normal memory cell may be replaced by a complement redundant memory cell.

In this way, a semiconductor memory device 200 in accordance with a first embodiment may store a data value in a redundant memory cell in the same manner as the data would have been stored in a normal memory cell. By doing so, electric conditions may be essentially the same so that an electrical stress may be essentially the same. Thus, test data for parts in which redundancy has been implemented may be improved without modifying a test pattern.

It should be noted that in the present embodiment, it may not be necessary to provide a test instruction signal TEST_EN as an input to address scramble circuit 3. By eliminating test instruction signal TEST_EN, it may be assured that a normal word line that is a true normal word line may be replaced with a redundant word line that is a true redundant word line and a normal word line that is a complement normal word line may be replaced with a redundant word line that is a complement redundant word line during all modes of operation. In this case, NAND gates (33 and 34) may be two input NAND gates.

Second Embodiment

A semiconductor memory device in a second embodiment may include redundant bit lines (columns) instead of redundant word lines (rows).

Figure 7:
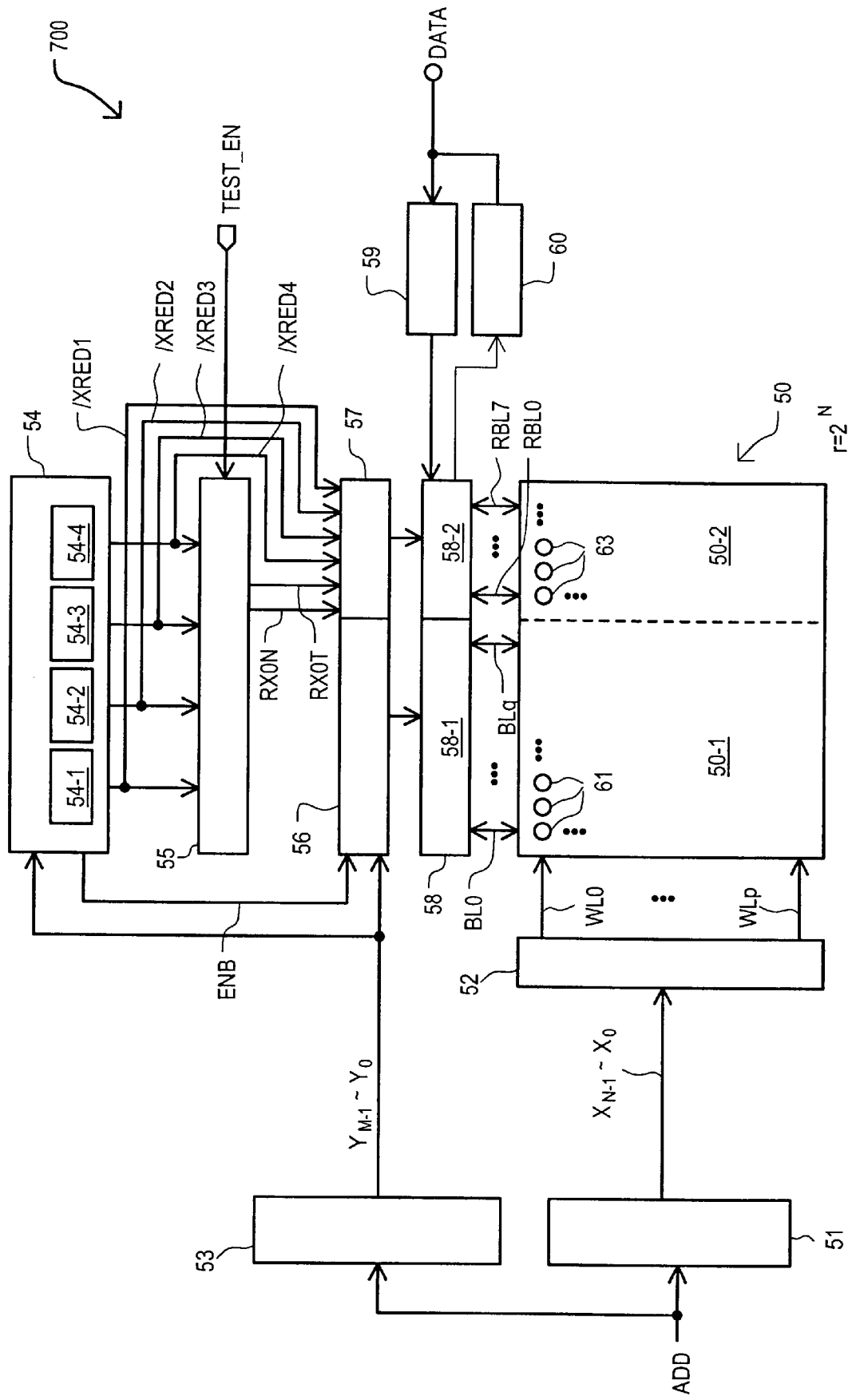
FIG. 7 is a block schematic diagram of a semiconductor memory device according to a second embodiment.

Referring now to FIG. 7, a block schematic diagram of a semiconductor memory device according to a second embodiment is set forth and given the general reference character 700. Semiconductor memory device 700 may be a dynamic random access memory (DRAM), as just one example.

Semiconductor memory device 700 may include a memory cell array 50, a row address buffer 51, a row decoder 52, a column address buffer 53, a redundant address decision circuit 54, an address scramble circuit 55, a column decoder 56, a redundant column decoder 57, a sense amplifier section 58, a write amplifier 59, and a read buffer 60.

Memory cell array 50 may include a normal memory section 50-1 and a redundant memory section 50-2. Normal memory section 50-1 may include normal memory cells 61 and redundant memory section 50-2 may include redundant memory cells 63.

Memory cell array 50 may include word lines (WL0 to WLp). Herein, p may satisfy $p=2^N-1$, where N is a natural number. Each word line (WL0 to WLp) may be connected to a row of memory cells including normal memory cells 61 and redundant memory cells 63.

Memory cell array 50 may include bit lines (BL0 to BLq) and redundant bit lines (RBL0 to RBL7). Herein, q may satisfy $q=2^M-1$, where M is a natural number. It is noted that each bit line (BL0 to BLq and RBL0 to RBL7) may include a complementary bit line pair. Normal bit lines (BL0 to BLq) may be provided in normal memory section 50-1 and redundant bit lines (RBL0 to RBL7) may be provided in redundant memory section 50-2. Each bit line (BL0 to BLq) may be connected to a column of normal memory cells 61. Redundant bit lines (RBL0 to RBL7) may be included in redundant memory section 50-2. Each redundant bit line (RBL0 to RBL7) may be connected to a row of redundant memory cells 63.

Semiconductor memory device 700 may receive an address signal ADD. The address signal ADD may correspond to a specific normal memory cell 61 that is to be accessed, hereinafter referred to as specific memory cell.

Address signal ADD may specify row addresses ($X_{N-1}$ to $X_0$) and column addresses ($Y_{M-1}$ to $Y_0$), which may be received in a time multiplexed manner. Row addresses ($X_{N-1}$ to $X_0$) and column addresses ($Y_{M-1}$ to $Y_0$) may be referred to simply as row addresses X and column addresses Y, respectively. Row address X may include N row address bits ($X_{N-1}$ to $X_0$) and column address Y may include M column address bits ($Y_{M-1}$ to $Y_0$).

Each word line (WL0 to WLp) may be selected by a unique value for row addresses X. Likewise, each bit line (BL0 to BLq) may be selected by a unique value for column addresses Y. In this way, a memory cell 11 may be selected in accordance with a particular combination of row addresses X and column addresses Y.

Row address buffer 51 may generate a row address X based on a received address ADD. Row decoder 52 may receive row address X and may select a word line (WL0 to WLp) based on the row address X value.

Column address buffer 53 may generate a column address Y based on a received address ADD. Redundant address decision circuit 54, address scramble circuit 55, column decoder 56, and redundant column decoder 57 may collectively operate to select a predetermined normal bit line (BL0 to BLq) or redundant bit line (RBL0 to RBL7) in accordance with the received value of column address Y.

Defective normal bit lines (BL0 to BLq) may be replaced with redundant bit line (RBL0 to RBL7). In this case, when addressed a defective normal bit line (BL0 to BLq) may not be selected and a redundant bit line (RBL0 to RBL7) may be selected instead.

By selecting a predetermined word line (WL0 to WLp) and a predetermined bit line (BL0 to BLq) or redundant bit line (RBL0 to RBL7) in accordance with values of a row address X and column address Y, a normal memory cell 61 or redundant memory cell 63 may be selected.

Sense amplifier section 58, write amplifier 59, and read amplifier 60 may operate to write or read data from the selected memory cell. During a write, write amplifier 59 may receive data from data signal line DATA and provide data to sense amplifier section 58. Sense amplifier section 58 may then write data into a selected memory cell. During a read, sense amplifier section 58 may receive and amplify data from a selected memory cell and provide data to read amplifier section 60. Read amplifier section may provide data to data signal line DATA. In this way, data may be read from or written to a selected memory cell. Although not shown, a plurality of memory cell may be selected in parallel so that a plurality of data may be essentially simultaneously written or read.

Sense amplifier section 58 may include normal sense amplifier section 58-1 and redundant sense amplifier section 58-2. Normal sense amplifier section 58-1 may read data from or write data to a normal memory cell 61 in normal memory section 50-1. Redundant sense amplifier section 58-2 may read data from or write data to a redundant memory cell 63 in redundant memory section 50-2.

Figure 8:
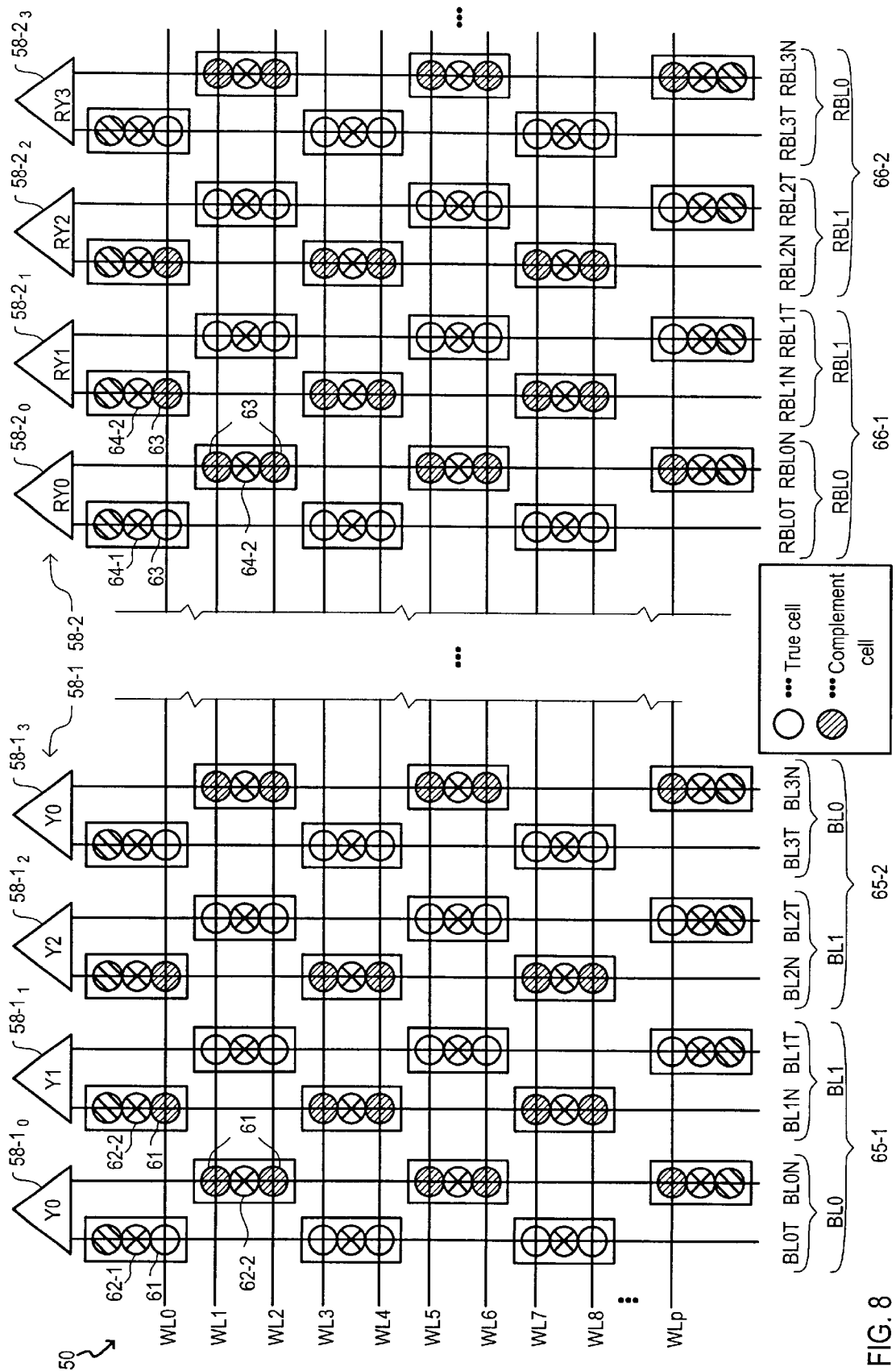
FIG. 8 is a schematic diagram of a memory cell array according to an embodiment

Referring now to FIG. 8, a schematic diagram of memory cell array 50 is set forth according to an embodiment.

Memory cell array 50 may include normal memory section 50-1 and redundant memory section 50-2. Normal memory section 50-1 may include normal memory cells 61. Normal memory cells 61 may be connected to normal bit lines (BL0 to WLq) in a column direction and word lines (WL0 to WLp) in a row direction. In order to avoid unduly cluttering the figure, only word lines (WL0 to WL8 and WLp) and normal bit lines (BL0 to BL3) are illustrated. Redundant memory section 50-2 may include redundant memory cells 63. Redundant memory cells 63 may be connected to redundant bit lines (RBL0 to RBL7) in a column direction and word lines (WL0 to WLp) in a row direction.

Each bit line (BL0 to BLq) may include complementary bit line pairs. For example, normal bit line BL0 may include a true normal bit line BL0T and a complement normal bit line BL0N. Likewise, as illustrated normal bit line BL1 may include a true normal bit line BL1T and a complement normal bit line BL1N.

Likewise, each redundant bit line (RBL0 to RBL7) may include complementary redundant bit line pairs. For example, redundant bit line RBL0 may include a true redundant bit line RBL0T and a complement redundant bit line RBL0N. Likewise, as illustrated redundant bit line RBL1 may include a true redundant bit line RBL1T and a complement redundant bit line RBL1N.

Normal memory cells 61 and redundant memory cells 63 may include two cell types classified as true data memory cells and complement data memory cells. True data memory cells are illustrated as non-hatched circles and may be connected to a true normal line (BL0T to BLqT) or a true redundant bit line (RBL0T to RBL3T). Complement data memory cells are illustrated as hatched circles and may be connected to a complement normal bit line (BL0N to BLqN) or complement redundant bit line (RBL0N to RBL3N). True memory cells may be electrically connected to a true normal bit line (BL0T to BLqT) with bit line contact 62-1. Complement memory cells may be electrically connected to a complement normal bit line (BL0N to BLqN) with bit line contact 62-2. True memory cells may be electrically connected to a true redundant bit line (RBL0T to RBL3T) with bit line contact 64-1. Complement memory cells may be electrically connected to a complement redundant bit line (RBL0N to RBL3N) with bit line contact 64-2.

Referring still to FIG. 8, normal bit lines (BL0 to BLq) may be respectively connected to normal sense amplifiers ($58\text{-}1_0$ to $58\text{-}1_q$) in normal sense amplifier section 58-1. In order to avoid unduly cluttering the figure, only normal bit lines (BL0 to BL3) and normal sense amplifiers ($58\text{-}1_0$ to $58\text{-}1_3$) are illustrated. Redundant bit lines (RBL0 to RBL7) may be respectively connected to redundant sense amplifiers ($58\text{-}2_0$ to $58\text{-}2_7$) in redundant sense amplifier section 58-2. In order to avoid unduly cluttering the figure, only redundant bit lines (RBL0 to RBL3) and redundant sense amplifiers ($58\text{-}2_0$ to $58\text{-}2_3$) are illustrated.

Normal bit lines (BL0 to BLq) may be classified as first normal bit lines and second normal bit lines. A first normal bit line may be one that when viewed from a row decoder 52 may have a complement normal bit line and then a true normal bit line. A second normal bit line may be one that when viewed from a row decoder 52 may have a true normal bit line and then a complement normal bit line. For example, in FIG. 8, normal bit lines (BL1 and BL2) may be first normal bit lines and normal bit lines (BL0 and BL3) may be second normal bit lines.

Redundant bit lines (RBL0 to BL7) may be classified as first redundant bit lines and second redundant bit lines. A first redundant bit line may be one that when viewed from a row decoder 52 may have a complement redundant bit line and then a true redundant bit line. A second redundant bit line may be one that when viewed from a row decoder 52 may have a true redundant bit line and then a complement redundant bit line. For example, in FIG. 8, redundant bit lines (RBL1 and RBL2) may be first redundant bit lines and redundant bit lines (RBL0 and RBL3) may be second redundant normal bit lines.

When viewed from the row decoder 52, normal bit lines (BL0 to BLq) may be arranged in a repeated order of second normal bit line, first normal bit line, first normal bit line, and second normal bit line. Likewise, when viewed from the row decoder 52, redundant bit lines (RBL0 to RBL7) may be arranged in a repeated order of second redundant bit line, first redundant line, first redundant bit line, and second redundant bit line.

Referring once again to FIG. 8, normal bit lines (BL0 to BL4) may be arranged into normal bit line pairs (65-1 and 65-2). Each normal bit line pair (65-1 and 65-2) may include one first normal bit line and one second normal bit line. For example, normal bit line pair 65-1 may include second normal bit line BL0 and first normal bit line BL1. Normal bit line pair 65-2 may include first normal line BL2 and second normal bit line BL3. In the same fashion, normal bit line pair (65-*t*) may include first normal bit line BL(2*t*-2) and second normal bit line BL(2*t*-1), where t is an integer greater than or equal to one and smaller than $2^{M-1}$.

In a similar manner, redundant bit lines (RBL0 to RBL4) may be arranged into redundant bit line pairs (66-1 and 66-2). Each redundant bit line pair (66-1 and 66-2) may include one first redundant bit line and one second redundant bit line. For example, redundant bit line pair 66-1 may include second redundant bit line RBL0 and first redundant bit line RBL1. Redundant bit line pair 66-2 may include first redundant line RBL2 and second redundant bit line RBL3. In a similar manner redundant bit lines (RBL5 to RBL7) may be arranged into redundant bit line pairs (66-3 and 66-4).

When it is determined through a characterization test that a normal memory cell 61 is defective, a redundant bit line (RBL0 to RBL7) may be used to replace a normal bit line (BL0 to BLq) that contains the defective normal memory cell 61. In the embodiment illustrated in FIG. 7, when a normal bit line (BL0 to BLp) includes a defective memory cell 61, a normal bit line pair (65-1 to 65-*t*) that includes the normal bit line (BL0 to BLq) with a defective memory cell 61 may be replaced with a redundant bit line pair (66-1 to 66-4). In this way, normal bit lines (BL0 to BLq) may be replaced in pairs corresponding to a normal bit line pairs (65-1 to 65-*t*) being replaced by redundant bit line pair (66-1 to 66-4).

In the foregoing, a normal bit line pair (65-1 to 65-*t*) that includes as least one defective memory cell 61 may be referred to as a defective normal bit line pair. A redundant bit line pair (66-1 to 66-4) used to replace a defective normal bit line pair may be referred to as a replacement redundant bit line pair.

One of the bit lines in the defective normal bit line pair may be a first normal bit line and the other bit line in the defective normal bit line pair may be a second normal bit line. Likewise, one of the word lines in the replacement redundant bit line pair may be a first redundant bit line and the other bit line in the replacement redundant bit line pair may be a second redundant bit line.

In semiconductor memory device 700 as illustrated in FIG. 7, address scramble circuit 55 may receive a test instruction signal TEST_EN.

When test instruction signal TEST_EN is high, the replacement redundant bit line pair may be mapped so that a first redundant bit line may replace a first normal line of defective normal word bit pair and a second redundant bit line may replace a second normal bit line of defective normal bit line pair.

To illustrate this, consider a first case in which normal bit line pair 65-1 is a defective normal bit line pair and redundant bit line pair 66-1 is a replacement redundant bit line pair. Defective normal bit line pair 65-1 may include at least one normal memory cell 61 that is defective. Defective normal bit line pair 65-1 may include normal bit line BL0 that is a second normal bit line and normal bit line BL1 that is a first normal bit line. Replacement redundant bit line pair 66-1 may include redundant bit line RBL0 that is a second redundant bit line and redundant bit line RBL1 that is a first redundant bit line. In this case, normal bit line BL0 (a second normal bit line) may be replaced by redundant bit line RBL0 (a second redundant bit line) and normal bit line BL1 (a first normal bit line) may be replaced by redundant bit line RBL1 (a first redundant bit line). In this case, the order of defective normal bit line pair 65-1 (second normal bit line—first normal bit line) with respect to row decoder 52 may be the same as an order of replacement redundant bit line pair 66-1 (second redundant bit line—first redundant bit line).

Next, consider a second case in which normal bit line pair 65-1 is a defective normal bit line pair and redundant bit line pair 66-2 is a replacement redundant bit line pair. Defective normal bit line pair 65-1 may include at least one normal memory cell 61 that is defective. Defective normal bit line pair 65-1 may include normal bit line BL0 that is a second normal bit line and normal bit line BL1 that is a first normal line. Replacement redundant bit line pair 66-2 may include redundant bit line RBL2 that is a first redundant bit line and redundant bit line RBL3 that is a second redundant bit line. In this case, normal bit line BL0 (a second normal bit line) may be replaced by redundant bit line RBL3 (a second redundant bit line) and normal bit line BL1 (a first normal bit line) may be replaced by redundant bit line RBL2 (a first redundant bit line). In this case, the order of defective normal bit line pair 65-1 (second normal bit line—first normal bit line) with respect to row decoder 52 may be the opposite as an order of replacement redundant bit line pair 66-2 (first redundant bit line—second redundant bit line).

However, when test instruction signal TEST_EN is high, a first redundant bit line may be used to replace a first normal bit line and a second redundant bit line may be used to replace a second normal bit line. This may hold true regardless as to the order of the bit line pairs. In this way, a semiconductor memory device 700 in accordance with a second embodiment may store a data value in a redundant memory cell in the same manner as the data would have been stored in a normal memory cell. By doing so, electric conditions may be essentially the same so that an electrical stress may be essentially the same. Thus, test data for parts in which redundancy has been implemented may be improved without modifying a test pattern.

However, when test instruction signal TEST_EN is low, a normal bit line may be replaced with a redundant bit line without regard as to whether the normal bit line is a first or second normal bit line and whether or not the redundant bit line is a first or second redundant bit line.

A defective normal bit line may be replaced with a replacement redundant bit line in accordance with redundant address decision circuit 54 and address scramble circuit 55. Construction and operation of redundant address decision circuit 54 and address scramble circuit 55 may be similar to the construction and operation of redundant address decision circuit 2 and address scramble circuit 3. An operating mode in which a defective normal bit line may be replaced with a replacement redundant bit line (RBL0 to RBL7) in accordance with a received column address Y may be similar to an operating mode in which a defective normal word line may be replaced with a replacement redundant word line (RWL0 to RWL7) in accordance with a received row address X.

In semiconductor memory device 700 in accordance with a second embodiment, a first normal bit line may be replaced with a first redundant bit line and a second normal bit line may be replaced with a second redundant bit line. Thus, a normal bit line may be replaced by a redundant bit line having essentially the same structure regarding complementary bit line pair and memory cell arrangement. In this way, a true normal memory cell may be replaced with a true redundant memory cell and a complement normal memory cell may be replaced with a complement redundant memory cell.

In semiconductor memory device 700 in accordance with a second embodiment, data may be stored such that a redundant memory cell may be stressed in essentially the same manner as a replaced normal memory cell would have been stressed when a certain test pattern is provided. Also, in semiconductor memory device 700, a redundant memory cells in a region may have essentially the same cell to cell stress as replaced normal memory cells would have had when a certain test pattern is provided. In this way, integrity of test data on redundant memory cells may be improved.

Although in the second embodiment, a memory cell array 50 has been illustrated including redundant bit lines (RBL0 to RBL7), a memory cell array 50 may include both redundant bit lines and redundant word lines. In this situation, row address buffer 51 and column decoder 52 may be replaced with row address buffer 1, redundant address decision circuit 2, address scramble circuit 3, row decoder 4, and redundant row decoder 5 as illustrated in the first embodiment.

In accordance with the embodiments, a semiconductor memory device has been provided in which electric conditions of a replacement redundant memory cell may be essentially the same as electric conditions would have been in a replaced normal memory cell had it not been replaced.

Also, in accordance with the embodiments, cell to cell electrical stress of a replacement redundant memory cell may be essentially the same as cell to cell electric conditions would have been in a replaced normal memory cell had it not been replaced.

In the embodiments, a normal memory cell may be determined to be defective when any specification may not be adequately met with regard to the normal memory cell in order to assure a properly functioning device. The defect may not be in the particular normal memory cell, but may also be in supporting circuits, such as a row decoder, word line, bit line, or sense amplifier, as just a few examples.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A memory device, comprising:

a plurality of normal memory cells including a first memory cell type that store a first logic level with a first memory cell state and a second memory cell type that store the first logic level with a second memory cell state;

a plurality of redundant memory cells including a first redundant memory cell type that store the first logic level with the first memory cell state and a second redundant memory cell type that store the first logic level with the second memory cell state; and a replacement section for replacing at least one normal memory cell with at least one redundant memory cell when the at least one normal memory cell has been determined to be defective, wherein the replacement section replaces the at least one normal memory cell with the at least one redundant memory cell in accordance with whether the at least one normal memory cell is of the first memory cell type or the second memory cell type.

2. The memory device according to claim 1, wherein:

the replacement section replaces the at least one normal memory cell with the at least one redundant memory cell so that the at least one normal memory cell of the first memory cell type is replaced with the at least one redundant memory cell of the first redundant memory cell type.

3. The memory device according to claim 1, wherein:

the replacement section replaces the at least one normal memory cell with the at least one redundant memory cell so that the at least one normal memory cell of the second memory cell type is replaced with the at least one redundant memory cell of the second redundant memory cell type.

4. The memory device according to claim 1, wherein:

the replacement section is coupled to receive a test instruction signal;

when the test instruction signal has a first test logic level, the replacement section replaces the at least one normal memory cell with the at least one redundant memory cell in accordance with whether the at least one normal memory cell is of the first memory cell type or the second memory cell type; and when the test instruction signal has a second test logic level, the replacement section replaces the at least one normal memory cell with the at least one redundant memory cell independently from whether the at least one normal memory cell is of the first memory cell type or the second memory cell type.

5. The memory device according to claim 1, wherein:

each of the plurality of normal memory cells and the plurality of redundant memory cells include a memory cell capacitor for storing a data value in accordance with a storage potential; and the first memory cell state is a state where the first logic level is stored with the storage potential higher than a predetermined potential and the second memory cell state is where the first logic level is stored with a storage potential lower than the predetermined potential.

6. The memory device according to claim 1, wherein:

the replacement section includes an address scramble circuit coupled to receive an address and generate a redundant address in accordance with whether the at least one normal memory cell is of the first memory cell type or the second memory cell type.

7. An operation method for a memory device including a plurality of normal memory cells and a plurality of redundant memory cells, comprising the steps of:

defining at least one replacement redundant memory cell from the plurality of redundant memory cells, when at least one of the normal memory cells has been determined to be a defective normal memory cell, to replace the at least one defective normal memory cell;

the plurality of normal memory cells include a first memory cell type that stores a first logic level with a first memory cell state and a second memory cell type that stores the first logic level with a second memory cell state and the plurality of redundant memory cells include a first redundant memory cell type that stores the first logic level with the first memory cell state and a second redundant memory cell type that stores the first logic level with the second memory cell state; and providing an address such that if the address corresponds to the at least one of the normal memory cells that has been determined to be defective, the at least one replacement redundant memory cell from the plurality of memory cells is selected such that if the at least one of the normal memory cells that has been determined to be defective is of the first memory cell type, the at least one replacement redundant memory cell is of the first redundant memory cell type.

8. The operation method of claim 7, wherein:

if the at least one of the normal memory cells that has been determined to be defective is of the second memory cell type, the at least one replacement redundant memory cell is of the second redundant memory cell type.

9. A memory device, comprising:

a plurality of normal memory cells including a first memory cell type that stores a first logic level with a first memory cell state and a second memory cell type that stores the first logic level with a second memory cell state;

a plurality redundant memory cells including a first redundant memory cell type that stores the first logic level with the first memory cell state and a second redundant memory cell type that stores the first logic level with the second memory cell state;

a replacement section for replacing at least one normal memory cell with at least one redundant memory cell when the at least one normal memory cell has been determined to be defective wherein in a first operating mode, the replacement section replaces the at least one normal memory cell with the at least one redundant memory cell so that normal memory cells of the first memory cell type are replaced with redundant memory cells of the first redundant memory cell type and normal memory cells of the second memory cell type are replaced with redundant memory cells of the second redundant memory cell type.

10. The memory device of claim 9, wherein:

the first operating mode is a test mode.

11. The memory device of claim 9, wherein:

in a second operating mode, the replacement section replaces the at least one normal memory cell with the at least one redundant memory cell so that normal memory cells are replaced independently from whether the at least one normal memory cell is of the first memory cell type or the second memory cell type.

12. The memory device of claim 9, wherein:

the replacement section is coupled to receive a plurality of addresses and provide a plurality of redundant select signals.

13. The memory device of claim 12, wherein:

the replacement section includes a redundant address decision circuit coupled to receive at least a first portion of the plurality of addresses and provide a replacement instruction signal and an address scramble circuit coupled to receive at least a second portion of the plurality of addresses and the replacement instruction signal and provide at least one redundant address.

14. The memory device of claim 13, wherein:

the address scramble circuit includes a control circuit and an address mapping circuit, the control circuit is coupled to receive at least a first one of the second portion of the plurality of addresses and the replacement instruction signal and provide an address mapping control signal and the address mapping circuit is coupled to receive the address mapping control signal which determines the mapping of the at least one redundant address with respect to at least a second one of the second portion of the plurality of addresses.

15. The semiconductor memory device of claim 14, wherein:

the address mapping control circuit is coupled to receive a first operating mode signal that has a first operating mode logic level when the memory device is in the first operating mode.

16. The memory device of claim 14, wherein:

the address mapping circuit includes a plurality of transfer gates coupled to receive the address mapping control signal and provide a controllable impedance path between the at least the second one of the second portion of the plurality of addresses and the at least one redundant address.

17. The memory device of claim 9, further including:

a plurality of word lines disposed in a row direction and a plurality of bit lines disposed in a column direction wherein the at least one replacement memory cell is included in a first redundant row of redundant memory cells and the at least one defective normal memory cell is included in a first normal row of normal memory cells.

18. The memory device of claim 17, wherein:

when the at least one replacement memory cell replaces the at least one defective normal memory cell, the first redundant row of redundant memory cells replaces the first normal row of normal memory cells and a second redundant row of redundant memory cells adjacent to the first redundant row of redundant memory cells replaces a second normal row of normal memory cells adjacent to the first normal row of normal memory cells.

19. The memory device of claim 9, further including:

a plurality of word lines disposed in a row direction and a plurality of bit lines disposed in a column direction wherein the at least one replacement memory cell is included in a first redundant column of redundant memory cells and the at least one defective normal memory cell is included in a first normal column of normal memory cells.

20. The semiconductor memory device of claim 19, wherein:

when the at least one replacement memory cell replaces the at least one defective normal memory cell, the first redundant column of redundant memory cells replaces the first normal column of normal memory cells and a second redundant column of redundant memory cells adjacent to the first redundant column of redundant memory cells replaces a second normal column of normal memory cells adjacent to the first normal column of normal memory cells.

* * * * *